United States Patent
Pfaff

(10) Patent No.: US 6,292,498 B1
(45) Date of Patent: Sep. 18, 2001

(54) METHOD OF CONTROLLING DIODE-LASER WAVELENGTH IN A DIODE-LASER PUMPED SOLID-STATE LASER

(75) Inventor: Juergen Pfaff, Burlingame, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 09/316,617

(22) Filed: May 21, 1999

(51) Int. Cl.$^7$ ........................................................ H01S 3/13

(52) U.S. Cl. .............................................. 372/32; 372/34

(58) Field of Search .......................................... 372/32, 34

(56) References Cited

U.S. PATENT DOCUMENTS

| | | | |
|---|---|---|---|
| 3,659,942 | * 5/1972 | Vergato | 365/51 |
| 5,754,574 | 5/1998 | Lofthouse-Zeis et al. | 372/34 |
| 5,926,495 | 7/1999 | Guch, Jr. | 372/75 |

FOREIGN PATENT DOCUMENTS

| | | | |
|---|---|---|---|
| 43 23 197 | 7/1993 | (DE) | H01S/3/133 |
| 02190290 | 7/1990 | (JP) | H01S/3/131 |

OTHER PUBLICATIONS

"Notification of Transmittal of the International Search Report or the Declaration," in PCT Patent Appln. No. PCT/US00/06812 (Int'l filing date Mar. 15, 2000), mailed Jul. 12, 2000, 8 pages in length.

* cited by examiner

Primary Examiner—Teresa M. Arroyo
Assistant Examiner—Gioacchino Inzirillo
(74) Attorney, Agent, or Firm—Stallman & Pollock LLP

(57) ABSTRACT

A method for controlling the emitting-wavelength of a diode-laser or diode-laser array in a diode-laser pumped solid-state laser (DPSS-laser) is disclosed. The DPSS-laser can be controlled, in a light-control mode, to provide constant output-power. Alternatively, the DPSS-laser can be controlled such that a constant current is supplied to the diode-laser. In the light-control mode, diode-laser temperature is periodically varied by a small temperature increment above and below a set temperature, and the diode-laser current required to provide constant DPSS-laser output-power is monitored. A difference in diode-laser current at temperatures higher and lower than the set temperature indicates that the emitting-wavelength of the diode-laser has changed from an optimum value. Changing the diode-laser set temperature to a value at which there is no difference in current at the higher and lower temperatures restores the emitting-wavelength of the diode-laser to the optimum value. In the current-control mode, DPSS-laser output-power is monitored at the higher and lower temperatures. Controlling diode-laser set temperature such that there is no difference in output-power at the higher and lower temperatures maintains the emitting-wavelength of the diode-laser at the optimum value.

8 Claims, 4 Drawing Sheets

PHASE SENSITIVE DETECTION

METHOD OF CONTROLLING DIODE-LASER WAVELENGTH IN A DIODE-LASER PUMPED SOLID-STATE LASER

TECHNICAL FIELD OF THE INVENTION

The present invention relates generally to diode-laser-pumped solid-state lasers (DPSS-lasers). The invention relates in particular to a DPSS-laser wherein the output wavelength of a pumping diode-laser is automatically maintained at an optimum value by a closed loop arrangement for controlling the temperature of the diode-laser.

DISCUSSION OF BACKGROUND ART

Diode-lasers are preferred as pump-light sources for solid-state lasers, inter alia, because they can be designed to emit at essentially any wavelength within a wavelength range determined by particular semiconductor materials used for their manufacture. The wavelength (pump-wavelength) can be selected to match a preferred absorption band of a solid-state gain-medium being pumped. This provides that essentially the entire output of the diode-laser is effective in pumping the gain-medium. This, together with the well-known efficiency of the diode-laser, provides a corresponding high efficiency for the DPSS-laser as a whole.

One disadvantage of such a highly selective pumping arrangement, however, is that if the emitting-wavelength of the diode-laser changes, the efficiency of the DPSS-laser can change dramatically. The output-wavelength of a diode-laser, at any given temperature, is known to change, over time, as the diode-laser is used, i.e., with operational "aging". Accordingly, if the performance of a DPSS-laser is to be maintained at an optimum level, some means must be provided for maintaining the emitting-wavelength of the diode-laser at the pump-wavelength.

SUMMARY OF THE INVENTION

The present invention is directed to a method for compensating for changes in the emitting-wavelength of a diode-laser light-source used to optically pump a solid-state gain-medium in a DPSS-laser. The diode-laser light-source is driven by electrical current supplied thereto. The diode-laser light-source has an emitting-wavelength dependent on the temperature of the diode-laser light-source. The gain-medium has a pump-wavelength at which pump-light is maximally absorbed therein.

In one embodiment of the present invention for maintaining the emitting-wavelength of the diode-laser light source at the pump-wavelength, electrical current supplied to the diode-laser light-source is controlled to maintain a constant light-output from the DPSS-laser. The temperature of the diode-laser light-source is periodically varied such that the temperature of the diode-laser light-source is periodically and sequentially higher and lower by equal increments than a nominal temperature. Electrical current supplied to the diode-laser light-source is periodically monitored at the higher and lower temperatures of the diode-laser light-source. If the electrical currents monitored at the higher and lower temperatures of the diode-laser light-source are different, the nominal temperature is changed to a value at which electrical currents monitored at the higher and lower temperatures are equal.

A difference in the monitored electrical currents at the higher and lower temperatures of the diode-laser light-source is detected when the emitting-wavelength of the diode-laser light-source is different from the optimally absorbed wavelength (pump-wavelength). Equalizing the monitored electrical currents at the higher and lower diode-laser light-source temperatures by changing the nominal temperature, changes the emitting-wavelength of the diode-laser light-source to the pump-wavelength.

In another embodiment of the present invention, the electrical current supplied to the diode-laser light-source is controlled such that it is constant. Again, the temperature of the diode-laser light-source is periodically varied such that the temperature of the diode-laser light-source is periodically and sequentially higher and lower by equal increments than a nominal temperature. Light-output of the DPSS-laser is monitored at the higher and lower temperatures of the diode-laser light-source. If the DPSS-laser light-outputs monitored at the higher and lower temperatures of the diode-laser light-source are different, the nominal temperature is changed to a value at which DPSS-laser light-outputs monitored at the higher and lower temperatures are equal.

A difference in the monitored DPSS-laser light-outputs at the higher and lower temperatures of the diode-laser light-source is detected when the emitting-wavelength of the diode-laser light-source is different from the pump-wavelength. Equalizing the monitored DPSS-laser light-outputs at the higher and lower diode-laser light-source temperatures by changing the nominal temperature changes the emitting-wavelength of the diode-laser light-source to the pump-wavelength.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
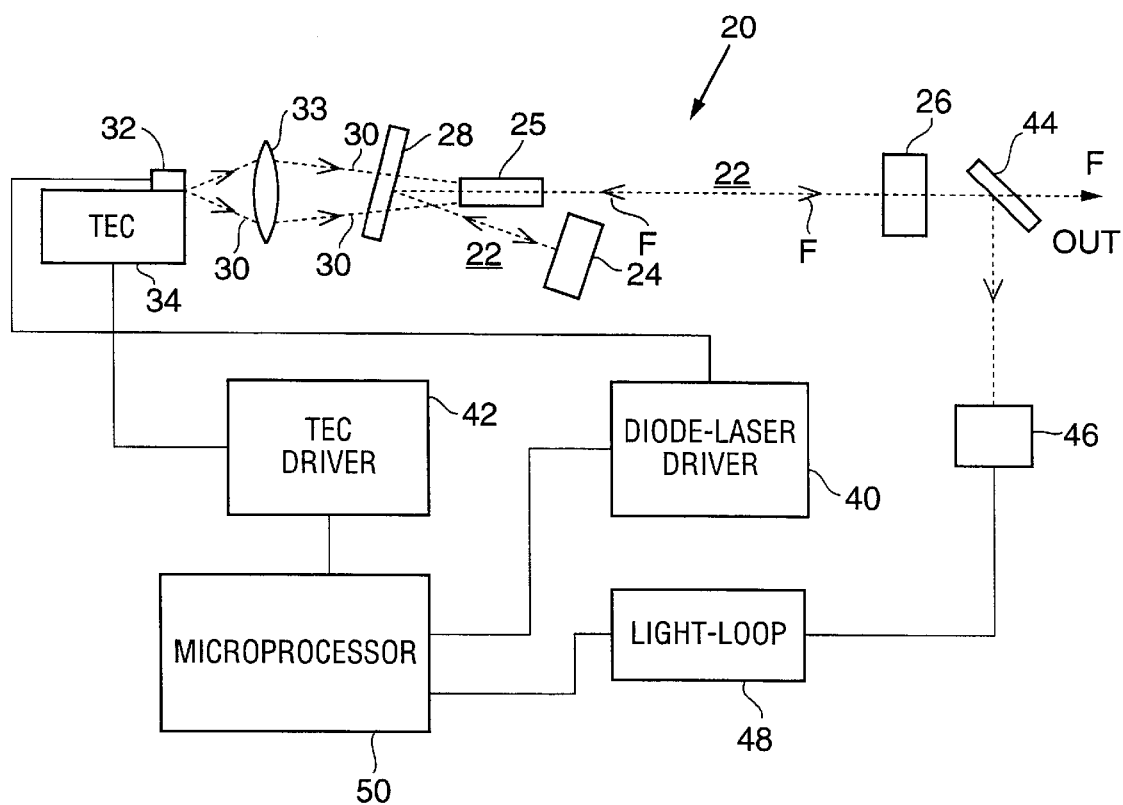
FIG. 1 schematically illustrates a DPSS-laser arranged for diode-laser wavelength control in accordance with the method of the present invention.

Turning now to the drawings, FIG. 1 schematically illustrates a DPSS-laser 20 arranged for diode-laser wavelength control in accordance with the method of the present invention. Laser 20 includes a folded resonator 22 terminated by mirrors 24 and 26 and including a gain-medium 25. Resonator 22 is folded by a fold mirror 28. Mirror 24 is a maximum-reflecting mirror at the output wavelength of laser 20. Mirror 26 is a partially-transmitting mirror at the laser output-wavelength, and serves as an output-coupling mirror.

Gain-medium 25 is pumped by light (pump-light) 30 delivered by a diode-laser 32. Fold-mirror 28 is maximally reflecting at the output-wavelength of laser 20 and maximally transmitting for pump-light 30, i.e., at the diode-laser emitting-wavelength. Pump-light 30 is focused by a lens 33, through fold-mirror 28, into gain-medium 25. Diode-laser 32 is mounted on a thermo-electric cooler (TEC) 34 for temperature control purposes. Fundamental laser-radiation generated by resonator 22 circulates in the resonator as indicated by arrows F. Fundamental radiation F exits resonator 22 as output-radiation via output-coupling mirror 26.

It should be noted here, that as the diode-laser wavelength control method of the present invention is applicable in essentially any DPSS-laser, regardless of resonator configuration, only a very simple laser resonator is depicted in FIG. 1 for simplicity of description. The method of the present invention is equally applicable in standing-wave resonators, traveling-wave (ring) resonators, whether generating only fundamental radiation, or including one or more optically-nonlinear crystals for intra-cavity frequency conversion of fundamental radiation.

It should also be noted that, for convenience of description, only a single diode-laser is illustrated. Those skilled in the art to which the present invention pertains will recognize that, in practice, typically a packaged array of diode-lasers is used to provide adequate pump-power. Such an array may be a one-dimensional array (diode-laser bar) or a two-dimensional array (stacked diode-laser bars). Those skilled in the art will also recognize that light from such an array would be delivered to lens by an optical-fiber or by a bundle of such optical-fibers. Principles of the present invention described below are equally applicable to controlling pump-light wavelength delivered by such a diode-laser array. In this description and the appended claims the terms "diode-laser" and "diode-laser light-source" are both used to collectively describe a single diode-laser or a one-dimensional or two-dimensional array of diode-lasers, however light from the diode-laser or array of diode-lasers is delivered to the gain-medium. Principles of the present invention are also applicable to resonators pumped by more than one diode-laser light-source. For example, a resonator in which pump-light is delivered to each end of gain-medium (rod or crystal) by two separate diode-laser light-sources. Preferably, each light source is separately controlled by the method of the present invention.

The form of diode-laser arrays and optical-fiber delivery of light from diode-laser arrays is well-known in the art to which the present invasion pertains and a description or depiction of such arrays and optical-fibers is not necessary for understanding principles of the present invention. Accordingly, no such description or depiction is presented herein.

Continuing with reference to FIG. 1, diode-laser 32 is connected with a diode-laser driver 40 which supplies regulated electrical-current to the diode-laser. Thermo-electric cooler 34 is connected with a TEC-driver 42 which supplies voltage for regulating the temperature of the thermo-electric cooler. A beamsplitter 44 directs a fraction of the output-power or light-output of laser 20 to a power monitor 46. Power monitor 46 is preferably a photocell, photodiode or the like. Output of power monitor 46 is delivered to a light-loop circuit 48. Light-loop circuit 48 compares instantaneous output-power of laser 20 interpreted from the output of power monitor 46 with a set value. From the comparison, light-loop circuit 48 adjusts diode-laser driver 40, if necessary, to adjust current delivered to (and accordingly, the output-power of) diode-laser array 32, correspondingly adjusting the output-power of laser 20 to the desired constant value.

TEC-driver 42, diode-laser driver 40, and light-loop circuit 48 are all controlled by a microprocessor 50. Microprocessor 50 is programmed such that the output-power of laser 20 can be maintained, as discussed above, at a constant level by varying current delivered to diode-laser 32 to compensate for operational power fluctuations or the like. Alternatively, current delivered to diode-laser can be maintained at a constant level.

From the description presented herein, those skilled in the art will recognize that the function of microprocessor 50 may be assumed by analog circuitry including, for example, a phase-sensitive detector (with phase-shift control) and an integrator. This or any other circuitry may be used without departing from the spirit and scope of the present invention.

Figure 2:
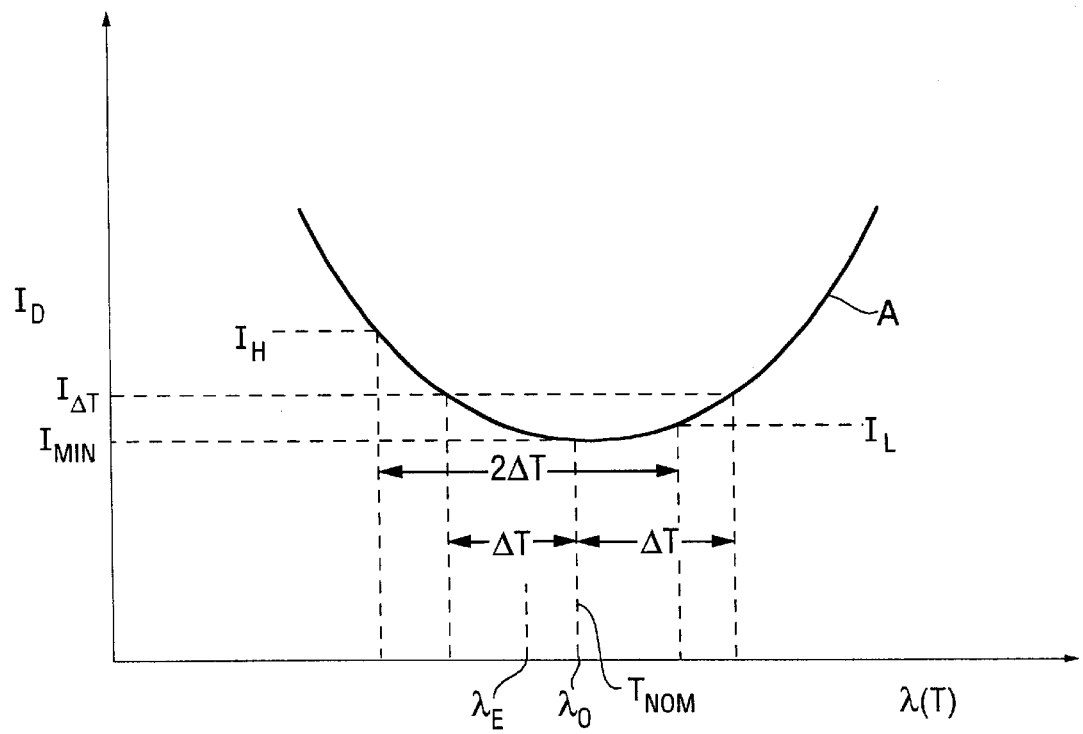
FIG. 2 is a graph schematically illustrating fluctuation of diode-laser current with diode-laser temperature at constant output output-power in a DPSS-laser in accordance with the method of the present invention.

Referring now to FIG. 2, a general form (curve A) of diode-laser current ID as a function of diode-laser wavelength λ (T) at constant output-power of laser 20 is illustrated. Diode-laser wavelength is, as indicated, a function of the temperature (T) of the diode-laser. A minimum diode-laser current $I_{MIN}$ is reached at a nominal diode-laser operating temperature $T_{NOM}$ when the diode-laser wavelength ($\lambda_0$) is maximally absorbed by gain-medium 25. In this condition, were the diode-laser temperature varied by a relatively small amount $\pm \Delta T$, higher and lower than the nominal temperature, diode-laser current $I_D$ would, in each case, increase to the same value $I_{\Delta T}$. Now, assuming that at nominal operating temperature $T_{NOM}$, as a result of aging, the diode-laser wavelength changes to a value $\lambda_E$, the same temperature variation will result in two different diode-laser currents $I_H$ and $I_L$.

It should be noted here that the temperature variation is preferably chosen to be relatively small compared with the general shape of the current versus wavelength curve, for example, less than 1.0° C. This minimizes potential problems due to possible asymetry of the curve. Such problems may be encountered if a larger temperature excursion is selected.

In one embodiment of the diode-laser wavelength control method of the present invention it is this difference between diode-laser currents measured at two different temperatures that is used to detect a variation in diode-laser wavelength from optimum value, and from a measured temperature-difference, change the diode-laser temperature to a level which will provide the optimum diode-laser wavelength. Simply described, the inventive method involves applying a periodic temperature excursion, via thermo-electric cooler 34, to diode-laser 32, the excursion being around a nominal or set temperature and monitoring, at different temperatures within the temperature excursion, the diode-laser current which is necessary to provide a predetermined constant output-power. If currents monitored at the different temperatures are different, the nominal operating temperature is varied until the currents monitored at the different temperatures are the same. This embodiment of the inventive diode-laser wavelength control method may be referred to as applicable to a light-control mode of operation of laser 20.

Figure 3:
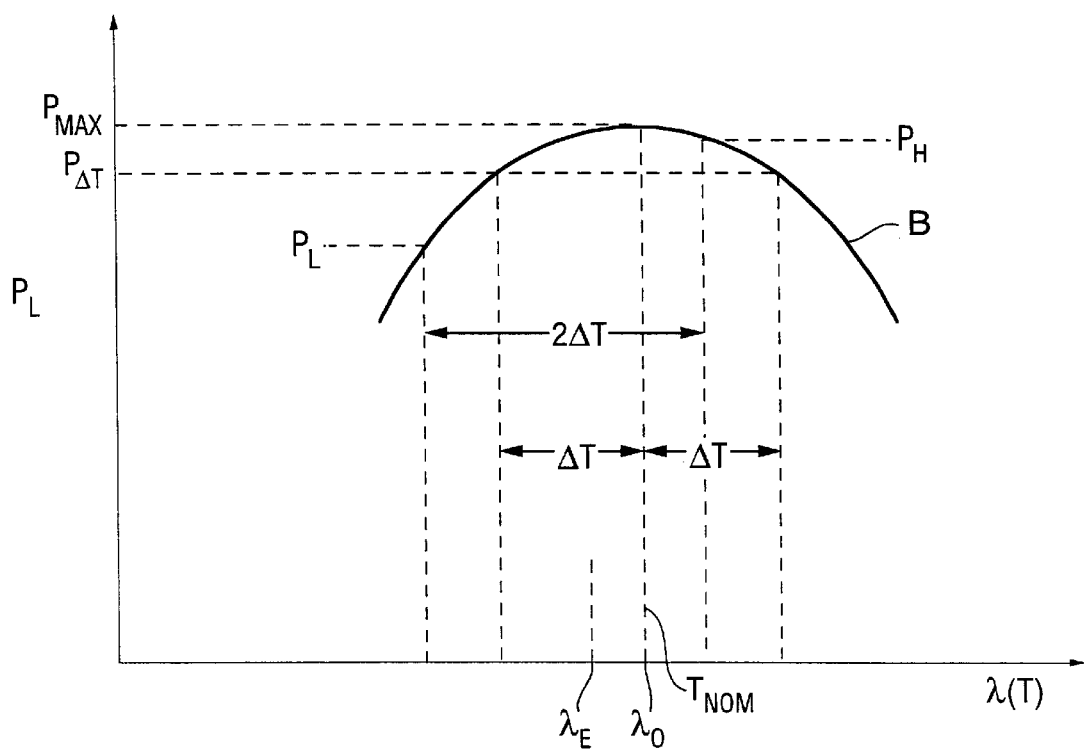
FIG. 3 is a graph schematically illustrating fluctuation of solid-state laser output-power with diode-laser temperature at constant diode-laser current in a DPSS-laser in accordance with the method of the present invention.

Referring now to FIG. 3, the general form (curve B) of output-power of laser 20 $P_L$ as a function of diode-laser wavelength is illustrated. A laser output-power $P_{MAX}$ is reached at the nominal diode-laser operating temperature $T_{NOM}$ when the diode-laser wavelength ($\lambda_0$) is maximally absorbed by gain-medium 25. In this condition, were the diode-laser temperature varied by $\pm \Delta T$, the output-power $P_L$ of laser 20 would increase to the same value $P_{\Delta T}$ at the extremes of the temperature excursion. Now assuming, again, that at nominal operating temperature $T_{NOM}$, the diode-laser wavelength changes to a value $\lambda_E$, the same temperature variation will result in two different output-powers $P_H$ and $P_L$ for laser 20.

In another embodiment of the diode-laser wavelength control method of the present invention, it is this difference between output-powers at different temperatures that is used to detect a variation in diode-laser wavelength from optimum value. Here again, a periodic temperature excursion is applied, via thermo-electric cooler 34, to diode-laser 32, the excursion being around the nominal or set temperature. In this embodiment of the inventive method, the output-power of laser 20 at constant diode-laser current is monitored at different temperatures within the range of the temperature excursion. If powers monitored at the different temperatures are different, the nominal operating temperature is varied until the powers monitored at the different temperatures are the same. This embodiment of the inventive diode-laser wavelength control method may be referred to as applicable to a current-control mode of operation of laser 20.

It is pointed out here, that, in practice, above-discussed curves A and B become steeper at increasingly higher and lower temperatures than nominal temperature. This provides that even if diode-laser current or output-power of laser 20 at two different temperatures above or below the nominal temperature are monitored, controlling diode-laser temperature to decrease the difference between IH and $I_L$ or between $P_H$ and $P_L$ to zero will result in restoration of the diode-laser wavelength to its optimum (maximally-absorbed) value $\lambda_0$. One preferred algorithm for carrying out the diode-laser wavelength control method of the present invention is set forth below with reference to FIGS. 4A and 4B.

It is preferable to first determine an initial temperature $T_{SET}$ at which a new diode-laser or diode-laser array will emit at the optimum wavelength. This is preferable as, because of manufacturing tolerances, the emission wavelength of nominally equivalent diode-lasers may vary from diode-laser to diode-laser. By way of example, if a temperature of 25° C. is selected as an approximate operating temperature of the diode-laser, the initial temperature will be given by an equation:

$$T_{SET}=25° C.+\Delta\lambda/K \quad (1)$$

where $\Delta\lambda$ is the difference between the optimum wavelength $\lambda_0$ and the actual emitting wavelength of the diode-laser, and k is the temperature coefficient of wavelength shift of the diode-laser. For an InGaAsP/GaAs diode-laser, nominally emitting at a wavelength of 808 nm, k is about 0.3 nm/° C.

Figure 4A:
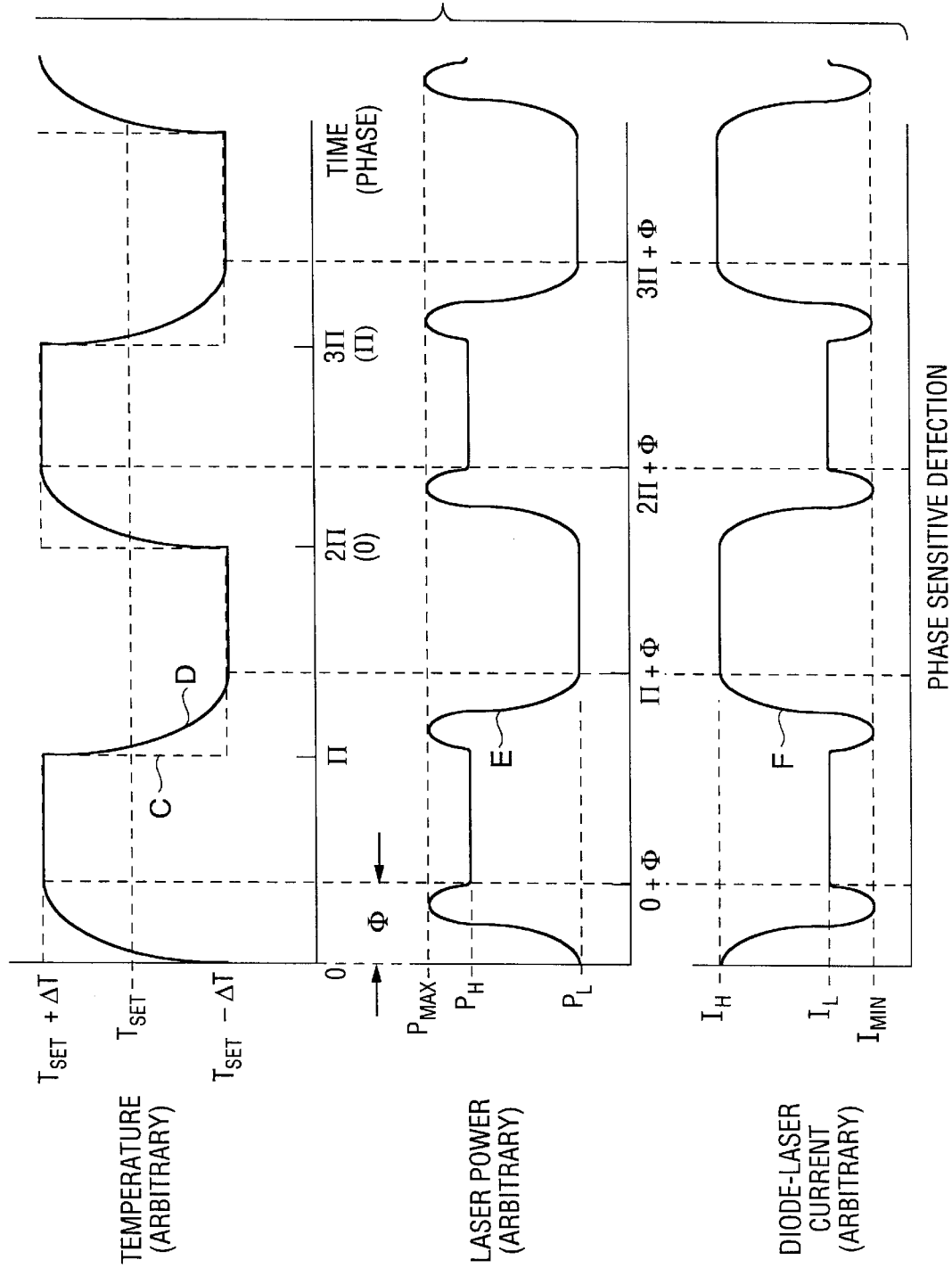
FIGS. 4A–B are graphs schematically illustrating synchronous measurement of diode-laser current or solid-state laser output-power synchronous with periodically-varying diode-laser temperature in accordance with the method of the present addition.

Continuing now with reference to FIG. 4A, which illustrates a condition at which diode-laser the 32 is emitting at a non-optimum wavelength $\lambda_E$, the initial temperature $T_{SET}$ is made the starting point for what may be described as a dither and track optimization of the diode-laser wavelength. The diode-laser temperature is periodically varied (dithered) by an amount $\pm\Delta T$ about initial temperature $T_{SET}$. As depicted in FIG. 4A, voltage to TEC 34 is changed in a step-wise or square-wave manner as indicated by dotted curve C. The rise and fall of the diode-laser temperature lags the corresponding changes in voltage applied to TEC 34. This gives rise to a periodic temperature variation schematically illustrated by curve D. The period (0 to 2Π) of the temperature variation is preferably several times longer than the thermal time constant of the diode-laser mounted on TEC 34, for example, from tens of seconds to several minutes, for example, about five minutes. The range of temperature variation $\Delta T$ is preferably about $\pm 0.3°$ C. The long cycle, being orders of magnitude greater than the sampling period of light loop circuit 48, provides that the dither and track operation does not interfere with constant power control of laser 20. The long cycle also minimizes the effect of the lag of temperature rise and fall in response to the variation of TEC voltage.

Depending on whether the dither and track optimization is carried out in the light-control mode or in the current-control mode, either diode-laser current at constant output-power of laser 20 or output-power of laser 20 at constant diode-laser current are measured synchronously with the periodic variation of diode-laser temperature (curves E and F respectively) but out of phase by an amount $\Phi$ with the period of temperature-variation. Phase shift $\Phi$ is selected to correspond to about the lag time of the rise and fall of diode-laser temperature. A suitable value can be determined simply by experiment.

Referring to curve E (depicting the current control mode), it can be seen that as the diode-laser temperature increases from the lowest value ($T_{SET}-\Delta T$) to the highest value of the temperature excursion ($T_{SET}+\Delta T$) the output-power of laser 20 rises to a value $P_{MAX}$ and then falls to a value $P_H$. As the diode-laser temperature decreases from the highest value ($T_{SET}+\Delta T$) to the lowest value of the temperature excursion ($T_{SET}-\Delta T$) laser output-power rises to a value $P_{MAX}$ and then falls to a value $P_L$. The value $P_{MAX}$ corresponds to the output-power of laser 20 when diode-laser 32 is emitting at the optimum wavelength $\lambda_0$.

Referring to curve F (depicting the light-control mode), it can be seen that as the diode-laser temperature increases from the lowest value ($T_{SET}-\Delta T$) to the highest value of the temperature excursion ($T_{SET}+\Delta T$) the current supplied to diode-laser 32 falls to a value $I_{MIN}$ and then rises to a value $I_L$. As the diode-laser temperature decreases from the highest value ($T_{SET}+\Delta T$) to the lowest value of the temperature excursion ($T_{SET}-\Delta T$) the diode-laser current falls to a value $I_{MIN}$ and then rises to a value $I_H$. The value $I_{MIN}$ corresponds to current supplied to diode-laser 32 it is emitting at the optimum wavelength $\lambda_0$.

The average current difference (power difference) between the $+\Delta T$ half-cycle and the $-\Delta T$ half-cycle is integrated to provide an error signal as follows.

Defining a value $I(+\Delta T)_{AVG}$ as being the average diode-laser current between $0+\Phi$ and $\Phi+\Pi$, and a value $I(-\Delta T)_{AVG}$ as being the average diode-laser current between $\Phi+\Pi$ and $\Phi+2\Pi$, a corrected diode-laser temperature $T_{NEW}$ in the light-control mode will be given by an equation:

$$T_{NEW}=T_{PREVIOUS}+\beta\{I(+\Delta T)_{AVG}-I(-\Delta T)_{AVG}\}\Delta T \quad (2)$$

where $\beta$ is a gain constant of the temperature-control feedback loop. It is proportional to the derivative of DPSS-laser power with respect to temperature in the current control mode and the derivative of diode-laser current with respect to temperature in the light-control mode. It is apparatus specific and can be simply determined by experiment. $T_{PREVIOUS}$, of course, has the value $T_{SET}$ at the beginning of a dither and track cycle. $T_{NEW}$ becomes $T_{SET}$ for the next dither and track cycle.

Similarly, defining a value $P(+\Delta T)_{AVG}$ as being the average output-power of laser 20 between $0+\Phi$ and $\Phi+\Pi$, and a value $P(-\Delta T)_{AVG}$ as being the average output-power of laser 20 between $\Phi+\Pi$ and $\Phi+2\Pi$, a corrected diode-laser temperature $T_{NEW}$ in the current-control mode will be given by an equation:

$$T_{NEW}=T_{PREVIOUS}+\beta\{P(+\Delta T)_{AVG}-P(-\Delta T)_{AVG}\}\Delta T \quad (3)$$

Figure 4B:
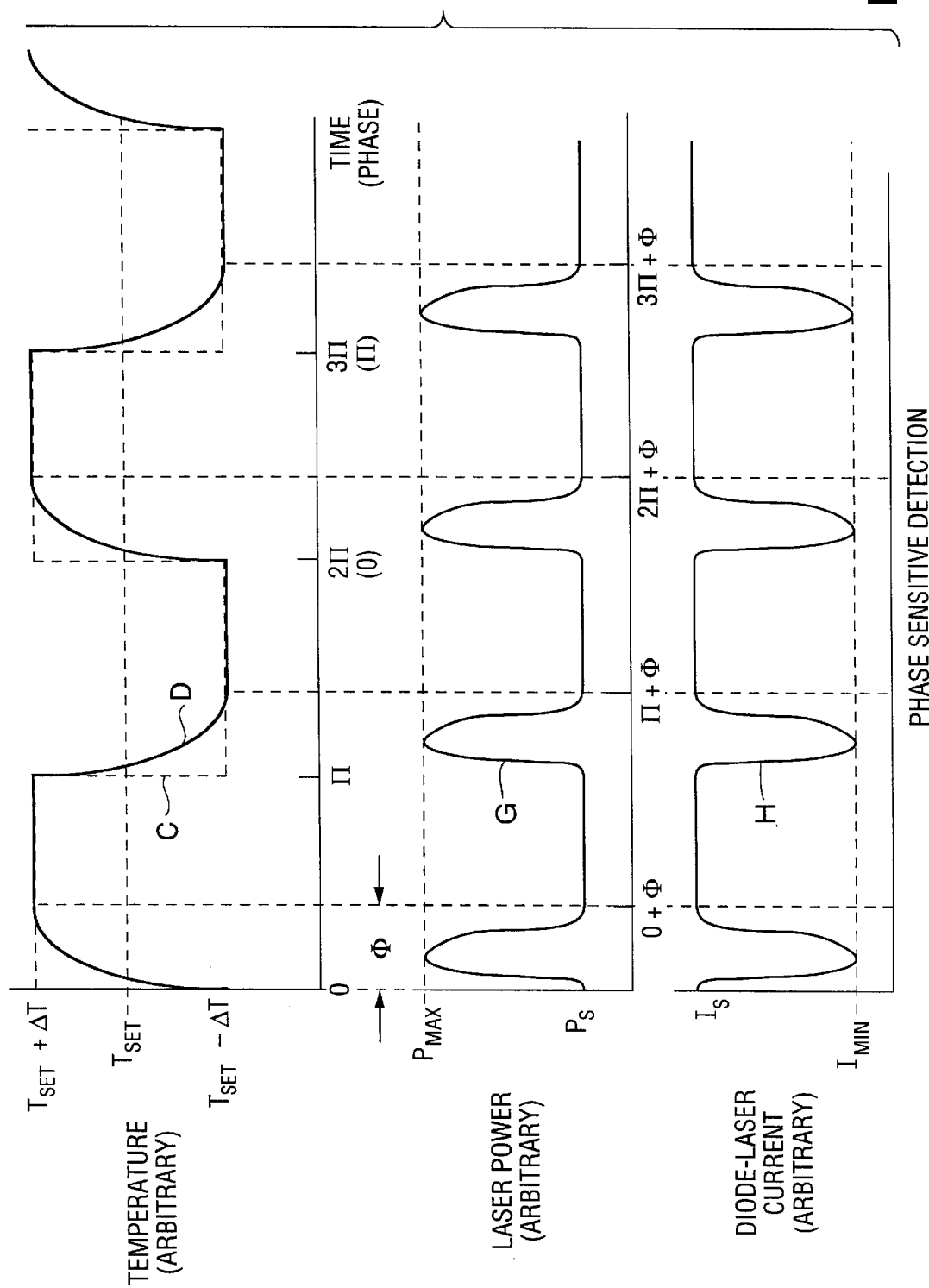

When $T_{NEW}$ becomes the optimum temperature, $P(+\Delta T)_{AVG}-P(-\Delta T)_{AVG}$ (or $I(+\Delta T)_{AVG}-I(-\Delta T)_{AVG}$) will be zero and the relationship between the temperature cycling of diode-laser 32 and the rise and fall of diode-laser current or output-power of laser 20 will be as illustrated schematically in FIG. 4B. Here, referring to curve G (depicting the current control mode), it can be seen that as the diode-laser temperature increases from the lowest value ($T_{SET}-\Delta T$) to the highest value of the temperature excursion ($T_{SET}+\Delta T$) the output-power of laser 20 rises to a value $P_{MAX}$ and then falls to a value $P_S$. As the diode-laser temperature decreases from the highest value ($T_{SET}+\Delta T$) to the lowest value of the temperature excursion ($T_{SET}-\Delta T$) laser output-power rises to a value $P_{MAX}$ and then falls to the same value $P_S$. The value $P_{MAX}$ again corresponds to the output-power of laser 20 when diode-laser 32 is emitting at the optimum wavelength $\lambda_O$.

Referring to curve H (depicting the lightcontrol mode), it can be seen that as the diode-laser temperature increases from the lowest value ($T_{SET}-\Delta T$) to the highest value of the temperature excursion ($T_{SET}+\Delta T$) the current supplied to diode-laser 32 falls to a value $I_{MIN}$ and then rises to a value $I_S$. As the diode-laser temperature decreases from the highest value ($T_{SET}+\Delta T$) to the lowest value of the temperature excursion ($T_{SET}-\Delta T$) the diode-laser current falls to a value $I_{MIN}$ and then rises to the same value $I_S$. The value $I_{MIN}$ again corresponds to current supplied to diode-laser 32 it is emitting at the optimum wavelength $\lambda_O$.

This algorithm provides that the diode-laser wavelength is always adjusted for minimum diode-laser current in the light-control mode, or that the diode-laser wavelength is always adjusted for optimum output-power of laser 20 in the current-control mode. Operating in the light-control mode is preferred for optimizing useful lifetime of the diode-laser. Operating in the current-control mode is preferred for obtaining optimum performance from laser 20.

It is pointed out here, that the above-described algorithm is but one possible algorithm by which principles of the present invention can be applied to controlling the emitting wavelength of a diode-laser or diode-laser array in a DPSS-laser. From the foregoing description of principles of the diode-laser wavelength control method of the present invention, those skilled in the art to which the present invention pertains may devise other algorithms or diode-laser temperature measurement sequences which may be more or less effective without departing from the spirit and scope of the present invention.

The present invention is not limited to the above-described algorithm or to any of the preferred embodiments described above. Rather, the invention is limited only by the claims appended hereto.

What is claimed is:

1. In a DPSS-laser having a gain-medium optically pumped by pump-light from a diode-laser light-source driven by an electrical current supplied thereto, the diode-laser light-source having an emitting-wavelength dependent on the temperature of the diode-laser light-source and the gain-medium having a pump-wavelength at which pump-light is maximally absorbed therein, a method of maintaining the emitting-wavelength of the diode-laser light-source at the pump-wavelength, comprising the steps of:
   (a) controlling the electrical current supplied to the diode-laser light-source to maintain a constant light-output from the DPSS-laser;
   (b) periodically varying the temperature of the diode-laser light-source, such that the temperature of the diode-laser light-source is periodically and sequentially higher and lower by equal increments than a nominal temperature;
   (c) monitoring the electrical current supplied to the diode-laser light-source at said higher and lower temperatures of said diode-laser light-source; and
   (d) changing said nominal temperature to a value at which electrical currents monitored at said higher and lower temperatures are equal.

2. The method of claim 1 wherein the diode laser laser light source is mounted on a thermo-electric cooler and the diode-laser light-source temperature is periodically varied by a square-wave increase and decrease of voltage supplied to said thermoelectric cooler.

3. The method of claim 2, wherein said diode-laser electrical current is monitored synchronously with said square-wave increase and decrease of voltage supplied to said thermoelectric cooler.

4. The method of claim 3, wherein said square-wave increase and decrease of voltage has a period $2\Pi$, and said diode-laser electrical currents monitored at said higher and lower temperatures are average diode-laser electrical currents over periods respectively from $0+\Phi$ to $\Phi+\Pi$ and $\Phi+\Pi$ and $\Phi+2\Pi$, where $\Phi$ is a phase retardation corresponding to a time-lag for increase and decrease of diode-laser temperature in response to said square-wave increase and decrease of voltage supplied to said thermoelectric cooler.

5. In a DPSS-laser having a gain-medium optically pumped by pump-light from a diode-laser light-source driven by an electrical-current supplied thereto, the diode-laser light-source having an emitting-wavelength dependent on the temperature of the diode-laser light-source and the gain-medium having a pump-wavelength at which pump-light is maximally absorbed therein, a method of maintaining the emitting-wavelength of the diode-laser light-source at the pump-wavelength, comprising the steps of:
   (a) controlling the electrical current supplied to the diode-laser light-source that the electrical-current is constant;
   (b) periodically varying the temperature of the diode-laser light-source, such that the temperature of the diode-laser light-source is periodically and sequentially higher and lower by equal increments than a nominal temperature;
   (c) monitoring light-output of the DPSS-laser at said higher and lower temperatures of said diode-laser light-source; and
   (d) changing said nominal temperature to a value at which DPSS-laser light-outputs monitored at said higher and lower temperatures are equal.

6. The method of claim 5 wherein the diode laser laser light source is mounted on a thermo-electric cooler and the diode-laser light-source temperature is periodically varied by a square-wave increase and decrease of voltage supplied to said thermoelectric cooler.

7. The method of claim 6, wherein said light-output of the DPSS-laser is monitored synchronously with said square-wave increase and decrease of voltage supplied to said thermoelectric cooler.

8. The method of claim 7, wherein said square-wave increase and decrease of voltage has a period $2\Pi$, and said monitored DPSS-laser light-outputs at said higher and lower temperatures are average DPSS-laser light-outputs over periods respectively from $0+\Phi$ to $\Phi+\Pi$ and $\Phi+\Pi$ and $\Phi+2\Pi$, where $\Phi$ is a phase retardation corresponding to a time-lag for increase and decrease of diode-laser temperature in response to said square-wave increase and decrease of voltage supplied to said thermoelectric cooler.

* * * * *